US012781682B2

(12) United States Patent
Yadlapalli et al.

(10) Patent No.: US 12,781,682 B2
(45) Date of Patent: Nov. 3, 2026

(54) SYSTEM FOR ENHANCING THERMOMECHNICAL EFFICIENCY AND REDUCING EMISSIONS AND NOISE LEVELS IN IC ENGINES

(71) Applicants: Kondala Rao Yadlapalli, Bhimadole RM (IN); Usha Ramani Yadlapalli, Bhimadole RM (IN)

(72) Inventors: Kondala Rao Yadlapalli, Bhimadole RM (IN); Usha Ramani Yadlapalli, Bhimadole RM (IN)

(73) Assignee: Kondala Yadlapalli, Andhra Pradesh (IN)

( * ) Notice: Subject to any disclaimer, the term of this patent is extended or adjusted under 35 U.S.C. 154(b) by 0 days.

(21) Appl. No.: 19/131,941

(22) PCT Filed: Apr. 14, 2025

(86) PCT No.: PCT/IN2025/050592
§ 371 (c)(1),
(2) Date: May 21, 2025

(87) PCT Pub. No.: WO2026/146511
PCT Pub. Date: Jul. 9, 2026

(65) Prior Publication Data
US 2026/0194025 A1 Jul. 9, 2026

(51) Int. Cl.
*G06F 19/00* (2018.01)
*F02D 41/20* (2006.01)
*H03K 5/00* (2006.01)

(52) U.S. Cl.
CPC ......... *F02D 41/20* (2013.01); *H03K 5/00006* (2013.01); *F02D 2041/2068* (2013.01)

(58) Field of Classification Search
CPC ...... F02M 27/045; F02M 27/04; F02M 31/18; F02D 41/20; F02D 2041/2006
(Continued)

(56) References Cited

U.S. PATENT DOCUMENTS 4,715,353 A 12/1987 Koike et al.
7,603,991 B2 10/2009 Rozim
(Continued)

FOREIGN PATENT DOCUMENTS

DE 3122295 A1 5/1982
IN 540860 B 11/2022

*Primary Examiner* — Logan M Kraft
*Assistant Examiner* — James J Kim
(74) *Attorney, Agent, or Firm* — Harita S Achanta

(57) ABSTRACT

The present invention relates to a system designed to enhance the thermomechanical efficiency of internal combustion engines while reducing emissions, noise, and maintenance requirements. The system comprising a booster, soft ferrite coils, a magnetic pick-up, and a feedback mechanism increases energy density within the engine. This enables operation on lean fuel mixtures, continuous removal of carbon deposits, improved combustion, and minimized pressure drops, thereby enhancing efficiency and reducing wear. The system reduces noise, vibrations, and particulate emissions under constant or variable engine conditions. By optimizing fuel consumption and reducing back pressure, it promotes cleaner, quieter, and sustainable engine operation while improving catalytic converter lifespan and achieving overall performance gains.

23 Claims, 4 Drawing Sheets

(58) Field of Classification Search
USPC .......................................................... 701/111
See application file for complete search history.

(56) References Cited

U.S. PATENT DOCUMENTS

| | | | | |
|---|---|---|---|---|
| 7,767,081 | B2 * | 8/2010 | Meeks | F02M 27/045<br>210/695 |
| 8,444,853 | B2 * | 5/2013 | Popov | B03C 1/288<br>210/695 |
| 9,305,692 | B2 * | 4/2016 | Kulesza | H01F 7/02 |
| 2014/0099253 | A1 * | 4/2014 | Kulish | F02M 27/045<br>210/222 |
| 2015/0003626 | A1 | 1/2015 | Trammell | |
| 2020/0300201 | A1 * | 9/2020 | Rodriguez | F02M 31/125 |

* cited by examiner

SYSTEM FOR ENHANCING THERMOMECHNICAL EFFICIENCY AND REDUCING EMISSIONS AND NOISE LEVELS IN IC ENGINES

CROSS-REFERENCE TO RELATED APPLICATIONS

The present application is a continuation of an International Application No. PCT/IN2025/050592 with a filing date of Apr. 14 2025, the entire disclosure of which is incorporated herein by reference for all purposes. The present application claims the benefit of Indian priority application No. 202541001032 with a filing date of 6 Jan. 2025, the entire disclosure of which is incorporated herein by reference for all purposes.

FIELD OF THE INVENTION

The invention is primarily related to a system for improving the thermomechanical efficiency of internal combustion (IC) engines, and engines such as those in liquid and gaseous fuel operated boilers, kilns, furnaces, ovens, or the like, and reducing exhaust emissions, noise levels, and maintenance.

BACKGROUND OF THE INVENTION

Globalization has caused an exponential rise in the number of vehicles, significantly contributing to increased air pollution. As exhaust emissions rise, the accumulation of carbon deposits inside the engine also increases. This leads to decreased fuel efficiency and necessitates more frequent engine maintenance, including the replacement of engine parts. Carbon deposits on the engine head and cylinder heads impair the efficient scavenging of exhaust gases after each working cycle, potentially reducing the thermal efficiency of subsequent cycles. Carbon deposits on injectors, carburetors, and nozzles affect the atomization angle and aerosol size of fuel oil during atomization. Excessive carbon buildup on engine parts necessitates the use of richer fuel mixtures to keep the engine running.

Excessive carbon buildup on piston rings results in the loss of seal flexibility, leading to the leakage of emission gases and/or hydrocarbon mixtures into the crankshaft chamber, thereby contaminating the lubricating oils. Additionally, carbon deposition inside the engine affects the quality of the lubricating oils as carbon particulates contaminate the lubricating oil. When carbon deposits are not expelled from the engine, they tend to adhere to the engine walls and form carbon flakes. These carbon flakes contaminate the engine and lubricating oils, leading to oil contamination and Conradson carbon residue (CCR). The presence of carbon particles in the engine and lubricating oils increases friction between moving engine parts, negatively affecting mechanical efficiency, increasing wear and tear, and reducing the lifespan of the oils. When excessive carbon is present inside the engine, it absorbs cetane and octane boosters, reducing the cetane and octane indices which leads to incomplete combustion. When carbon deposits form on these valve seats in the engine, it causes the valves to leak, significantly impacting engine performance and necessitating immediate maintenance.

In the case of diesel or gas fired boilers, incomplete combustion of the air-gas mixture leads to increased emissions. Also, carbon buildup on heat transfer coils can sharply reduce the heat transfer efficiency of boilers, requiring regular mechanical cleaning of coil surfaces to maintain optimal thermal performance.

Carbon ash deposited on internal engine parts such as piston, engine heads, and piston head, retain absorbed heat from the previous cycle and become hotspots. These hotspots which are the source of ignition may cause pre-ignition of hydrocarbon air fuel mixture within the engines resulting in the deterioration and thermal efficiency of engines and also increased emissions and noise level. Pre-ignition may also cause heavy detonation in engines thereby increasing their noise levels.

In jet propulsion engine, complete combustion depends on air to fuel ratio. If the mixture is too rich, it leads to incomplete combustion, resulting in carbon buildup on the jet engine blades. This buildup alters the blade angle profile, necessitating periodic cleaning. Excessive carbon deposition can also create hot spots and damage the blades.

Technologists have developed numerous solutions to enhance IC engine efficiency. Ultrasonic and supersonic high frequency fuel injectors effectively atomize and mix air and fuel, enabling engines to run on lean mixtures. This helps reduce emissions and noise levels while improving fuel efficiency.

U.S. Pat. No. 7,603,991B2 discloses a method for reducing fuel consumption and emissions in internal combustion engines. The fuel and air streams are charged with high voltage via electrodes to provide a charge of opposite polarity. Ultrasonic vibrations are applied to the air and fuel streams to enhance mixing and ionization. This improves combustion by creating a more homogeneous mixture, leading to reduced fuel consumption and emissions.

DE3122295A1 discloses a fuel injector for atomizing fuel in a combustion chamber thereof. It comprises an ultrasonic injector that includes a fuel inlet, ultrasonic element, and a transducer for generating high-frequency vibrations with large amplitudes. The ultrasound element also comprises an anchoring device, with a front end and rear end for holding the ultrasonic injector in place and optionally an insulator which is axially connected to the front end of the anchoring device and serves to attenuate post-oscillations, thereby enhancing fuel atomization prior to its injection into the combustion device.

U.S. Pat. No. 4,715,353A discloses an ultrasonic wave type fuel atomizing apparatus for an internal combustion engine for supplying atomized fuel to said internal combustion engine. It comprises an ultrasonic wave vibrator in an intake passage of the internal combustion engine for atomizing fuel supplied thereto by vibrating at ultrasonic wave frequencies, an oscillation circuit for producing ultrasonic waves used to drive the ultrasonic wave vibrator, a means for supplying an oscillation output of the oscillation circuit to the ultrasonic wave vibrator by increasing the oscillation output, and a feedback circuit for controlling oscillation frequency of the oscillation circuit in accordance with an output of the ultrasonic vibrator.

Though the ultrasonic and supersonic high frequency fuel injectors disclosed in the prior art effectively atomize and mix air and fuel, enabling engines to run on lean mixtures leading to fuel efficiency, these high frequency waves are limited in their ability to travel through liquids and are mainly confined to fuel injectors. They cannot travel through exhaust gases or clean engine heads. A significant challenge is designing an ultrasonic wave generator that operates at high temperatures, as the power required to run a piezoelectric sensor varies with the temperature of the injector of an IC engine. Additionally, piezoelectric generators vibrate during operation, requiring crystals to have some clearance to vibrate effectively. This clearance changes with temperature due to thermal expansion of materials. The temperature varies with engine load, speed, and fuel. Carbon deposition on piezoelectric vibrating plates can hinder the functionality of ultrasonic fuel injectors.

Noise generated by IC engines primarily arises from combustion processes, mechanical vibrations, and exhaust gas flow. Various approaches have been tried to mitigate noise in IC engines. Excessive back pressure in IC engines increases fuel consumption, decreases engine power, disrupts emission control systems, and can have negative impact on engine performance. Efforts to manage back pressure involve optimizing exhaust system design by improving the geometry of manifolds, pipes, and mufflers. Advanced technologies such as Variable Valve Timing (VVT) and efficient exhaust gas recirculation (EGR) systems maintain proper exhaust flow to reduce back pressure risks.

US20150003626A1 discloses a noise cancellation process for cars, aircraft, ships, and trains and the like by capturing the cabin's audio, converting it to a digital signal, and analyzing it for ambient noise. A negative phase sound wave is then created to cancel out the identified noise. The original noise and the correction wave are combined, reducing the unwanted noise in the audio. The system uses a cardioid response to focus on front sounds and minimize side and rear pickup, avoid feedback from the monitors.

IN540860B discloses a system for improving fuel efficiency and reducing emissions in vehicles by generating high frequency waves of different frequency ranges, and delivering the same to fuel line wherein the waves collide with each other to generate a broad range of frequency waves. The device comprises electrodes immersed in the fuel line, which transmit high-frequency waves thereby enhancing fuel atomization and improving the mixing of air and fuel.

Hence, there is a strong need to develop technologies that can overcome the aforementioned drawbacks while improving fuel efficiency, reducing emissions, noise, and engine maintenance, while also contributing to a quieter and more sustainable environment. The inventors of the present invention have developed a system to enhance the thermomechanical efficiency, while also reducing the emissions, noise levels, and maintenance of the engine. This has been achieved by employing a system that enhances the energy density within the engine thereby leading to reduction of emissions, noise levels, and maintenance of the engine.

OBJECT OF THE INVENTION

The principal object of the present invention is to enhance the thermomechanical efficiency of engines.

Another object of the invention is to reduce emissions produced by engines.

Yet another object of the invention is to promote complete combustion of fuel thereby reducing hydrocarbon emissions.

Still yet another object of the invention is to minimize particulate matter emissions from engines.

Further yet another object of the invention is to enable engine operation with lean fuel mixtures, enhancing fuel efficiency and reducing emissions.

Another object of the invention is to reduce noise generation during engine operation.

Yet another object of the invention is to improve engine efficiency by continuously scavenging carbon deposits within the engine.

Still yet another object of the invention is to reduce emissions by removing carbon deposits from stationary and automotive engines, thereby improving mechanical efficiency, reducing wear and tear, and maintaining engine lifespan.

Further yet another object of the invention is to enhance the performance and extend the life of catalytic converters by reducing their operational load and scavenging carbon deposits.

Another object of the invention is to ensure minimal pressure drop in fuel flow lines and exhaust systems.

Yet another object of the invention is to improve overall engine performance by reducing pressure drops within the engine system.

Still yet another object of the invention is to reduce back pressure on engines.

Further yet another object of the invention is to use a feedback mechanism for optimized control of power and fuel consumption.

Another object of the invention is to regulate energy density and energy pumped into the fuel based on engine load and fuel consumption.

Yet another object of invention is to reduce emissions, noise levels, and vibrations of the engine when the engine is run at constant speed.

Still another object of the invention is to reduce emissions and noise levels of engines especially when engines are in acceleration mode.

Further yet another object of the invention is to reduce emissions, noise levels, and vibrations of the engine when the engine is run at variable load and acceleration mode.

Another object of the invention is to lower the maintenance costs associated with engines.

SUMMARY OF THE INVENTION

The present invention is related to a system designed to enhance the thermomechanical efficiency of engines by increasing energy density, thereby optimizing power and fuel consumption, reducing noise levels, and lowering maintenance requirements. Said system comprises key components including a booster (B), soft ferrite coils (FC1-FW1, FC2-FW2, FC3-FW3, FC4-FW4), a magnetic pick-up (MPU), and feedback mechanism (FBM). Said booster (B) facilitates increased intersection of low power high frequency waves generated from frequency generators (FG1, FG2, FG3, FG4) within a fuel line and/or inside the internal combustion (IC) engine, while the soft ferrite coils (FC1-FW1, FC2-FW2, FC3-FW3, FC4-FW4) increase energy density to enhance overall performance. Said magnetic pick-up (MPU) picks up magnetic fluxes from the fuel line and transmits signals to said feedback mechanism. Said magnetic pick-up (MPU) and feedback mechanism (FBM) work collaboratively to regulate energy density, energy pumped into the fuel and power output effectively based on the fuel consumption and load on the engine. According to another embodiment, said system can be placed in a fuel tank or fuel line of the IC engines.

Figure 2:
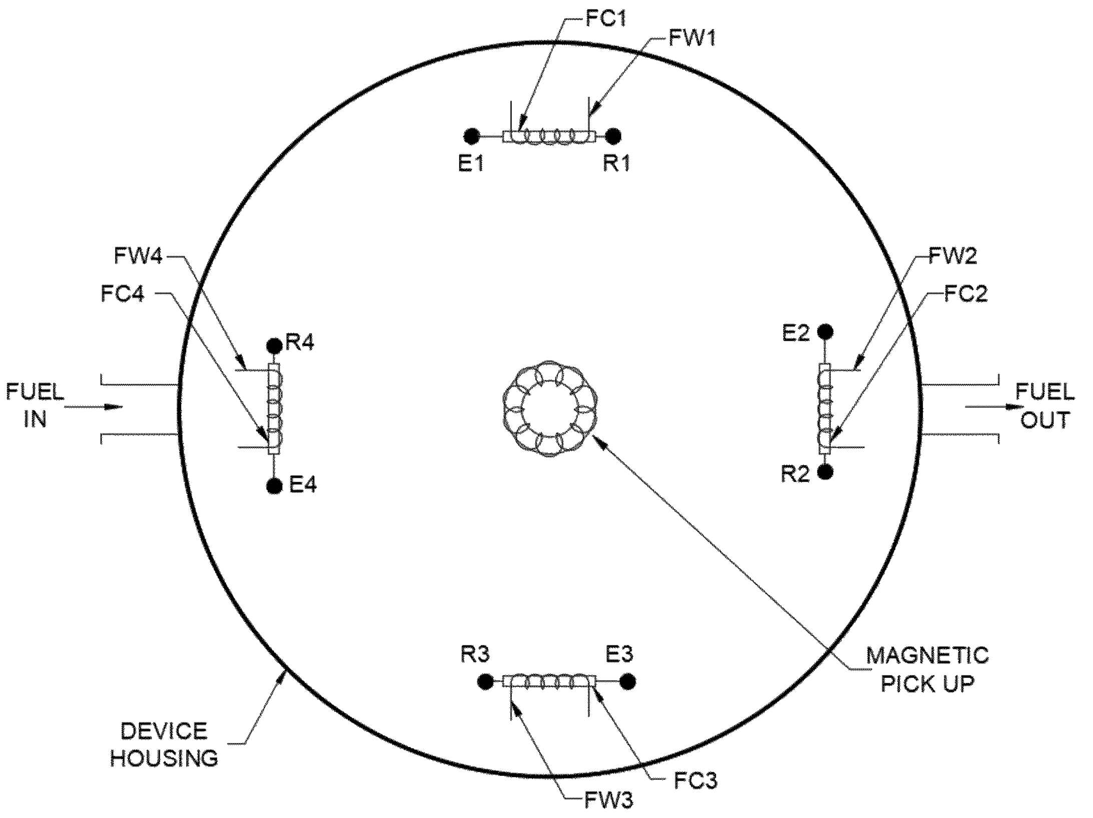
Figure 3:
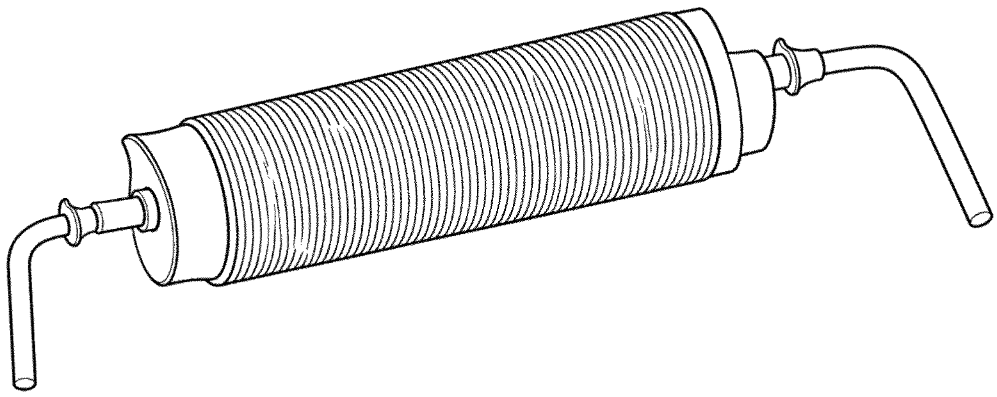
Figure 4:
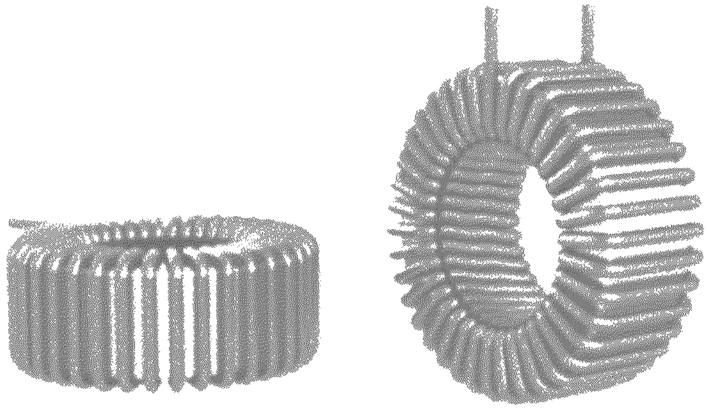
Figure 5:
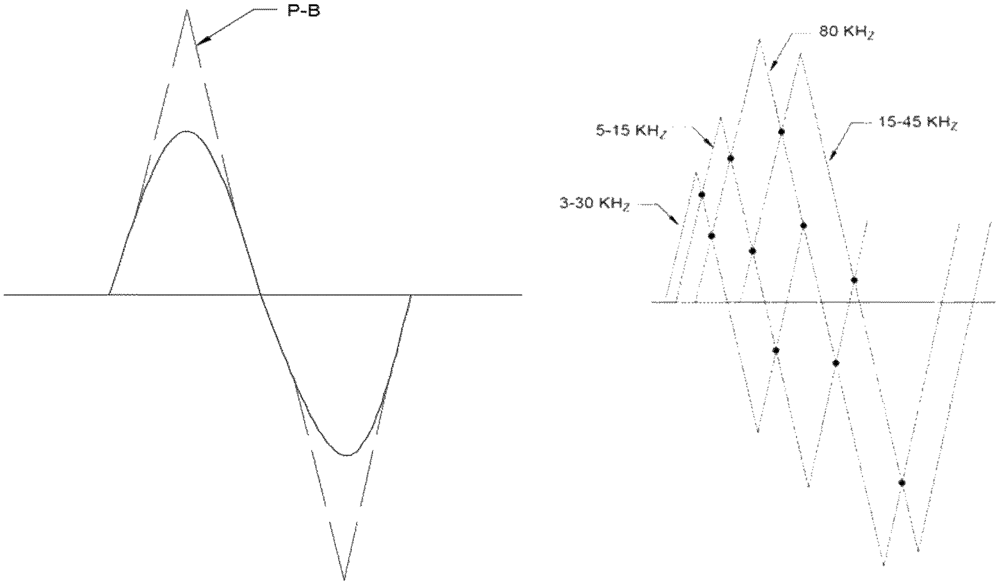
Figure 6:
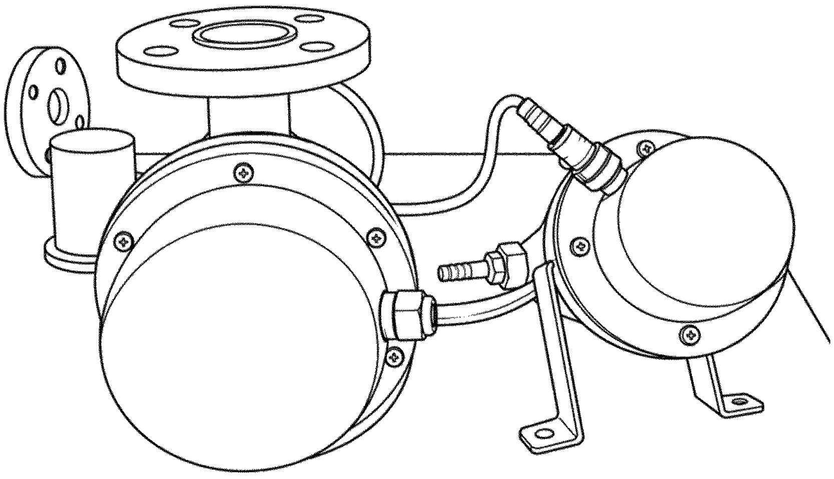

that enhances intersection of low power high frequency waves and energy density placed in a fuel tank of IC engine;

FIG. 2 illustrates the arrangement of fuel line, ferrite coils, emitters, receivers, and magnetic pick-up (MPU) in the novel system of the present invention;

FIG. 3 shows a representative ferrite coil with one end of the winding connected to an emitter and another end of said winding connected to a receiver;

FIG. 4 shows a representative magnetic pick-up (MPU) used in the system of the present invention;

FIG. 5 illustrates the wave signal peaks (P-B) enhanced by booster of the novel system of the present invention; and FIG. 6 shows the housing (H) of the novel system of the present invention.

DETAILED DESCRIPTION OF THE INVENTION

The summary of the present invention, as well as the detailed description, are better understood when read in conjunction with the accompanying drawings that illustrate one or more possible embodiments of the present invention.

The following detailed description includes references to the accompanying drawings, which form part of the detailed description. The drawings show illustrations in accordance with example embodiments. These example embodiments are described in enough detail to enable those skilled in the art to practice the present subject matter. However, it may be apparent to one with ordinary skill in the art that the present invention may be practiced without these specific details. In other instances, well-known methods, procedures and components have not been described in detail so as not to unnecessarily obscure aspects of the embodiments. The embodiments can be combined, other embodiments can be utilized, or structural and logical changes can be made without departing from the technical scope of the invention. The following detailed description is, therefore, not to be taken as a limiting sense. In this document, the terms “a” or “an” are used, as is common in patent documents, to include one or more than one. In this document, the term “or” is used to refer to a non-exclusive “or”, such that “A or B” includes “A but not B”, “B but not A”, and “A and B”, unless otherwise indicated.

The present invention is related to a system designed to improve fuel and power efficiency of an engine. A person skilled in the art may also understand that the system of the present invention is applicable to any heat engine such as vehicular engines, internal combustion engines, generator sets, jet propulsion engines, ships and marine applications, and other engines such as those in liquid and gaseous fuel operated boilers, kilns, furnaces, ovens, or the like.

Figure 1A:
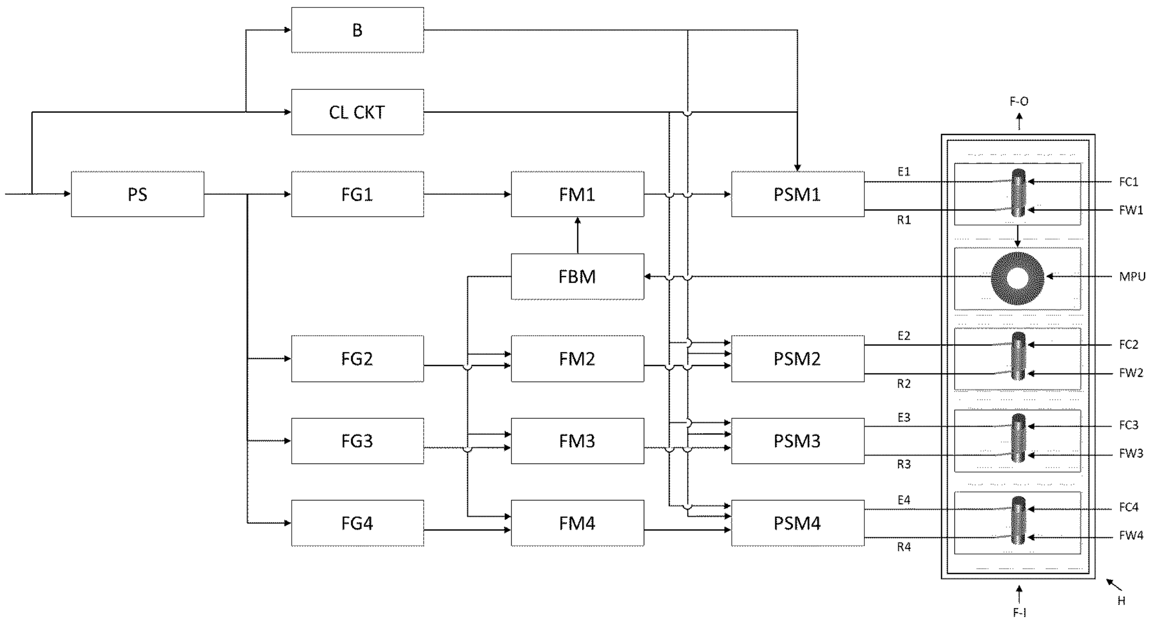
FIG. 1*a* is a schematic illustration of a system of the present invention comprising a circuit fit with a booster (B) that enhances intersection of low power high frequency waves and energy density placed in a fuel line of IC engine.
Figure 1B:
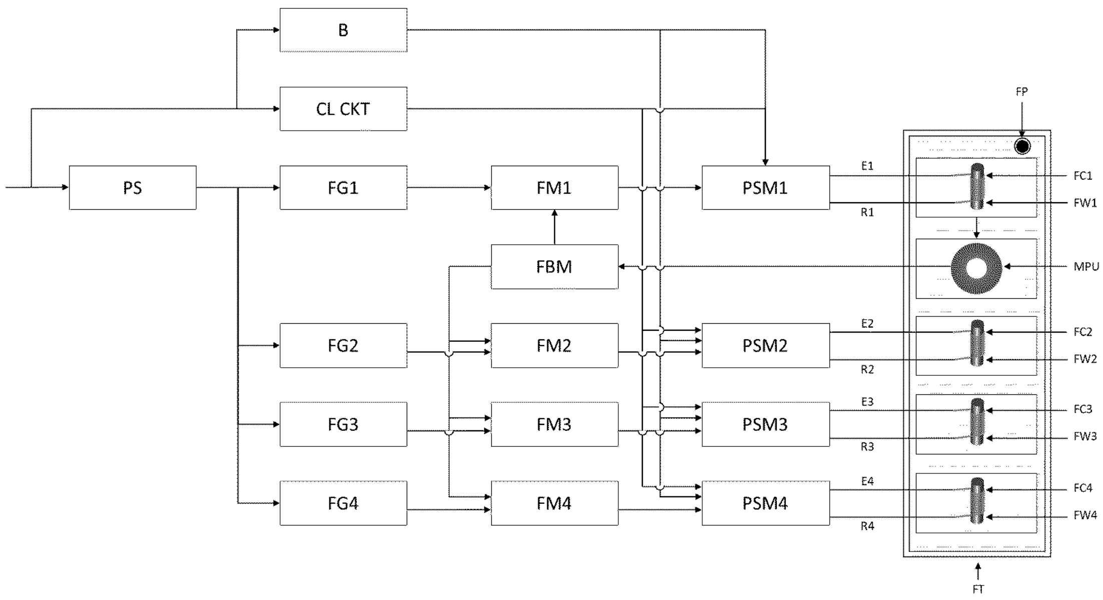
FIG. 1*b* is a schematic illustration of a system of the present invention comprising a circuit fit with a booster (B)

The present invention relates to a system designed to enhance fuel and power efficiency by improving the atomization and mixing of liquid and gaseous fuels with combustion air, while simultaneously reducing emissions, noise levels, and maintenance needs through continuous engine cleaning. The system of the present invention shown in FIG. 1*a* and FIG. 1*b* comprises a booster (B) that enables increased interaction of low-power, high-frequency waves of varying frequencies generated by frequency generators (FG1, FG2, FG3, FG4) within a fuel line of IC engine as shown in FIG. 1*a* or a fuel tank of IC engine as shown in FIG. 1*b*; ferrite coils housed within a housing (H) shown in FIG. 6, to increase energy density in the fuel line or fuel tank, thereby optimizing fuel performance; a magnetic pick-up (MPU) (shown in FIG. 4) that senses the magnetic fluxes from the fuel line or fuel tank and transmits these signals to a feedback mechanism (FBM), which, in turn, provides input to frequency modulators (FM1, FM2, FM3, FM4) to dynamically regulate energy density, energy pumped into the fuel, power output, and fuel consumption based on load conditions and fuel flow rates. Said signals aid in increasing or decreasing energy depending on the rate of fuel consumption per hour. Generally, when rate of fuel is more at high speeds, acceleration mode, and high load conditions ramp up, engine consumes more fuel and regular energy pumped is not sufficient. Hence, by measuring the fluxes of the high frequency waves in the fuel, the system of the present invention, increases power during such running conditions of the engine. The innovative configuration of the system of the present invention facilitates superior fuel efficiency and combustion control.

By way of an example, the system of the present invention is herein detailed considering placement of the system of the present invention in the fuel line of IC engine.

In accordance with the present invention, high frequency impulse waves are generated and passed through the fuel line, wherein they collide to create a broader range of high frequency waves.

The system described in the present invention enhances atomization of the fuel by using a booster (B) to enhance the intersection of the low power, high frequency waves within the fuel lines. These waves travel along with the fuel to the injector or carburetor of the engine. By improving the atomization and mixing of gaseous and liquid fuels with combustion air, the system achieves better combustion efficiency and thermal efficiency while also reducing emissions, noise levels and vibrations of the engine.

The low power high frequency waves are sent into the fuel pipelines. When different ranges of low power high frequency waves are pumped into the fuel oils, they collide with each other in the fuel media, and generate a wider spectrum of waves which have the ability to travel in any medium-gaseous, liquid or a combination thereof. The frequency ranges used in the system of the present invention are a) 5 to 15 Kilo Hertz, b) 3 to 30 Kilo Hertz, c) 15 to 45 Kilo Hertz, and d) 80 KHz fixed frequency (mean frequency is 80 KHz). The novel system of the present invention comprises a booster that increases output voltage and power. As shown in FIG. 5, said booster raises the peak-to-peak value of output signals (P-B) by 15-25% for better intersection of waves of different ranges of frequencies pumped into the fuel, through discharge electrodes comprising emitters (E1, E2, E3, E4) and receivers (R1, R2, R3, R4) and soft ferrite circuit comprising a plurality of ferrite coils (FC1-FW1, FC2-FW2, FC3-FW3, FC4-FW4). Each ferrite coil comprises of a soft ferrite core made from soft magnetic material, which is a combination of iron oxide and metal oxides such as nickel, zinc, or manganese, with a winding wire wound on said soft ferrite core. Said soft ferrite circuit enhances energy dissipation of power into electrically insulated fuels. Said waves travel along with the fuel to the engine’s injector or carburetor. Said emitters (E1, E2, E3, E4) enable said waves to pass through the ferrite circuit while said receivers (R1, R2, R3, R4) receive the waves that pass through the ferrite circuit. The maximum frequency is achieved at least for a short period of time with the aid of said booster (B). Said boosting of the pulses is irrespective of the current limit but within the current limit. By improving the atomization and mixing of gaseous and liquid fuels with combustion air, the system achieves better combustion efficiency and thermal efficiency.

Fuels are naturally poor conductors and highly insulating, making it challenging to enhance wave dissipation and system performance. However, in accordance with the embodiments of the present invention, soft ferrite coils comprising of soft ferrite cores (FC1, FC2, FC3, FC4) with winding wires (FW1, FW2, FW3, FW4) wound on said soft ferrite cores (FC1, FC2, FC3, FC4), as shown in FIG. 3, are positioned as shown in FIG. 2. Said ferrite coils (FC1-FW1, FC2-FW2, FC3-FW3, FC4-FW4) that are placed inside a small vessel (measuring approximately 1 inch in length and 0.5 inches in diameter) containing the fuel allow the application of higher power levels. This significantly improves the efficiency of the system. Said soft ferrite coils (FC1-FW1, FC2-FW2, FC3-FW3, FC4-FW4) are used to receive flux density within the fuel. Said soft ferrite coils (FC1-FW1, FC2-FW2, FC3-FW3, FC4-FW4) are immersed in the fuel passing through said housing (H). The number of soft ferrite coils that can be used in accordance with the embodiments of the present invention, depends on the rate of fuel consumption. For example, when fuel consumption is 10 kgs/hour to 20 kgs/hour, the number of soft ferrite coils used is 2, when the fuel consumption is 20 kgs/hour to 40 kgs/hour, the number of soft ferrite coils used is 4, and when the fuel consumption is 100 kgs/hour to 200 kgs/hour, the number of soft ferrite coils used is 8. Said soft ferrite coils may be placed in a single enclosure or a plurality of enclosures in a series or parallel.

According to the embodiments of the present invention, the electrodes, namely, the emitters (E1, E2, E3, E4) and receivers (R1, R2, R3, R4) are immersed in the fuel within said housing (H) wherein the fuel enters through an inlet (F-I), interacts with said electrodes (E1, R1, E2, R2, E3, R3, E4, R4), and exits through an outlet (F-O). Said soft ferrite coils (FC1-FW1, FC2-FW2, FC3-FW3, FC4-FW4) pump energy more efficiently to improve fuel efficiency.

Energy dissipation depends on the resistance of the coil wound around the ferrite core and number of turns of the winding coil. Energy density depends on the resistance which in turn depends on the number of turns of the winding coil on the ferrite core. For example, in the case of large engines where fuel consumption is high, the number of turns of said winding coil is more. The number of coils or turns of said winding (FW1, FW2, FW3, FW4) on the soft ferrite core (FC1, FC2, FC3, FC4) depends on engine capacity and fuel consumption. For example, if fuel consumption is less than 2 Lit per Hour (LPH), the number of turns is 4; if the fuel consumption is 2 LPH to 10 LPH, the number of turns is 10; if the fuel consumption is 11 to 20 LPH, the number of turns is 20; if the fuel consumption is 21 to 50 LPH, the number of turns is 30; and if the fuel consumption is 51 to 100 LPH, the number of turns is 100.

Said emitters (E1, E2, E3, E4) and receivers (R1, R2, R3, R4) used in the system of the present invention are made of conductive metals. The number of emitters and receivers used varies depending on the application. For example, for a scooter, 4 electrodes (2 emitters and 2 receivers) are used; for four-wheelers 8 electrodes (4 emitters and 4 receivers) are used; and for stationary applications where furnace oil, heavy furnace oils, or LDO are used, 16 electrodes (8 emitters and 8 receivers) are used. A plurality of systems of the present invention may be used in series in the case of high fuel consuming engines such as 1 to 5 Mega watt engines.

In accordance with the embodiments of the present invention, a magnetic pick-up (MPU) placed in said housing (H) picks up the feedback fluxes generated in the fuel and sends the signals to feedback mechanism (FBM). Said fluxes are generated based on the load and flow rate of the fuel pumped into the engine. Said feedback mechanism (FBM) sends signals to the circuit to either reduce or increase energy power supply based on the requirement. Said signals received by the feedback mechanism (FBM), are sent to the frequency modulators (FM1, FM2, FM3, FM4) to control the power. For example, when an engine is run at higher load and speeds, more fuel is needed, and when the rate of fuel is more, the energy pumped to the ferrite circuit should also be more.

Said soft ferrite coils are immersed in the fuel to sense the magnetic fluxes within the fuel, and the rate of magnetic fluxes sensed by the magnetic pick-up (MPU) is inversely proportion to the rate of fuel flow. When the rate of fuel flow increases, for example, at higher load and/or higher speed, the magnetic pick-up (MPU) sends signals to the feedback mechanism (FBM) which are passed to the frequency modulators (FM1, FM2, FM3, FM4) to raise the frequency and increase the power so as to meet the requirement of the engine. This, in turn, depends on the load and speed of the engine, and is directly proportional to the fuel flow rate.

The main function of said soft ferrite coils (FC1-FW1, FC2-FW2, FC3-FW3, FC4-FW4) is to increase the flux generated in the fuel as the fuel is electrically insulated.

Fumes or smoke produced at high temperatures typically consist of carbon dioxide ($CO_2$), carbon monoxide (CO), sulfur oxides ($SO_x$), nitrogen oxides ($NO_x$), and particulate matter. Due to the non-linear flow path of fuels and combustion gases, there is a high likelihood of carbon and unburnt hydrocarbons being deposited along the way. To address this, wave frequencies capable of traveling at extremely high speed, for instance, 100 to 1,000 times faster than the velocity of the fuel and smoke, are required. When high frequency waves exceed the velocity of the fuel and air-gas mixture within the engine, they enhance atomization and ignition, resulting in improved combustion. This leads to greater thermal efficiency in the engine while significantly reducing exhaust emissions.

When the engine operates at temperatures exceeding 500 degrees Celsius, catalytic reactions trigger a series of processes, including oxidation, pyrolysis, cracking, dehydrogenation, coking, and polymerization. These reactions cause carbon deposition on the inner surfaces of engine components, making its removal a significant challenge.

When the fuel passes through the internal combustion (IC) engine, carbon is deposited in the carburetor and/or inlet and outlet valves of the engine. In the case of spark ignition IC engines, carbon also gets deposited on the engine heads and flue gas manifold, piston top crown, piston rings, engine suction valves, and delivery valves. The deposited carbon causes deterioration in engine performance in terms of its thermal efficiency and/or mechanical efficiency.

According to an embodiment of the present invention, carbon deposition within the engine and its various components such as the carburetor, injectors, valves, valve seats, piston crown, piston rings, and engine heads, is mitigated through the high intersections of high frequency waves achieved through the system of the present invention. These waves collide and scrape off deposited carbon. The continuous bombardment of low power high frequency waves, improves the mixing of fuel oils and/or gases with combustion air, ensuring ongoing cleaning of both stationary and moving engine components, including the piston head, engine head, piston rings, vane blades, and heat transfer coils, along the fuel path during the operating cycle. EGR (Exhaust Gas Recirculation) system is very common in current day engines for the reduction of $NO_x$ emissions. EGR releases partial exhaust gases into the suction of the engine wherein the burnt gases mix with the air drawn by the engine. EGR comprises a valve actuator to control the opening position with the aid of oxygen sensors installed in the exhaust of the engine. This valve actuator is operated by a small electric motor, and works in a reciprocating motion. Carbon deposition on the valve actuator is a major issue for all engines. The carbon particles deposited thereon choke the valve actuator and increase load on the motor, sometimes jamming it completely. It is not good for the engine if the valve actuator is only in the "OPEN" position or only in the "CLOSED" position. The system of the present invention cleans carbon particles deposited on the EGR valve actuator and does not allow any fresh carbon particle deposition on the EGR valve actuator. This persistent cleaning process prevents carbon buildup on engine parts, maintains engine health, reduces wear and tear, lowers emissions, and enhances mechanical efficiency. The system of the present invention also facilitates continuous cleaning of heat transfer surfaces in boilers and fuel-operated heaters, further improving overall efficiency.

The present invention also addresses the continuous cleaning of the catalytic converter, enhancing its efficiency while alleviating potential catalyst poisoning caused by excessive sulfur. This reduces back pressure on the engine, thereby improving its overall performance. The system of the present invention also enhances the performance of the catalytic converter and extends its lifespan by removing carbon deposits, thereby reducing its workload. By effectively scavenging carbon buildup, the system of the present invention helps prevent catalytic converter damage such as puncturing, ensuring its reliable operation and improved durability.

FIG. 1*a* and FIG. 1*b* are schematic illustrations of a system of the present invention comprising a circuit fit with a booster (B) that is used in the system of the present invention to enhance the thermomechanical efficiency of engines while reducing emissions, noise levels generated by the engine, and maintenance of the engine. A booster (B) is connected parallel to the circuit, as shown in FIG. 1*a* and FIG. 1*b*. The power required to run the system of the present invention is low and is provided through the power supply unit (PS). A maximum power of 100 milli ampere and 12 VDC is drawn from the power source such as battery in the case of a vehicle, through a starter control circuit. This power passes through a controlled power supply unit (PS) wherefrom the power passes through the frequency generators (FG1, FG2, FG3, FG4), and the electrical low power high frequency waves pass to the frequency modulators (FM1, FM2, FM3, FM4). These low power high frequency waves then pass to the power switching modules (PSM1, PSM2, PSM3, PSM4). The high frequency waves from said power switching modules (PSM1, PSM2, PSM3, PSM4) pass to the discharge electrodes (E1, R1, E2, R2, E3, R3, E4, R4). Said discharge electrodes (E1, R1, E2, R2, E3, R3, E4, R4) are immersed into the fuel passed through a housing (H) as shown in FIG. 1*a* or in the fuel tank (FT) having a fuel pump (FP) as shown in FIG. 1*b*. The fuel enters said housing (H) through a fuel inlet (F-I) and exits through a fuel outlet (F-O) according to an embodiment of the present invention. According to another embodiment of the present invention, the system of the present invention, said discharge electrodes (E1, R1, E2, R2, E3, R3, E4, R4) which are sealed, are immersed in the fuel. The electrode seals could be glass to metal seals, ceramic to metal seals, or rubber to metal seals. The discharge electrodes (E1, R1, E2, R2, E3, R3, E4, R4) immersed in the fuel line are made up of conductive steel and are non-corrosive. Said discharge electrodes (E1, R1, E2, R2, E3, R3, E4, R4) are placed at 18 mm to 36 mm distance between two sets of emitter and receiver combination.

Said discharge electrodes (E1, R1, E2, R2, E3, R3, E4, R4) are connected to said soft ferrite coils (FC1, FW1, FC2, FW2, FC3, FW3, FC4, FW4 respectively). Said soft ferrite coils (FC1, FW1, FC2, FW2, FC3, FW3, FC4, FW4) are immersed in the fuel that flows through the housing (H).

According to the embodiments of the present invention, the plurality of frequency ranges employed are:

5 to 15 Kilo Hertz (mean frequency of 10 KHz),
3 to 30 Kilo Hertz (mean frequency of 16.5 KHz),
15 to 45 Kilo Hertz (mean frequency of 30 KHz), and
80 KHz Fixed frequency (mean frequency is 80 KHz).

As low power high frequency waves are passed through fuels including but not limited to gasoline, diesel, light diesel oils, furnace oils, and compressed natural gas, aviation fuels, and liquified petroleum gas lines which are flammable there are potential hazards. Hence, it is essential to regulate the power supply. A common feedback mechanism (FBM) with a momentary snap action reset circuit shown in FIG. 1*a* and FIG. 1*b*, momentarily switches off and switches on the power supply once every hour to reset the circuit, while a current limiting circuit module (CL CKT) also shown in FIG. 1*a* and FIG. 1*b* limits current to a maximum of 100 milli amperes and 12 VDC which is below 100 milli watts power to ensure intrinsically safe power supply. Snap action resetting is required to eliminate any internal back-power. Such resetting is done every minute to avoid incorrect indication to a driver or operator of the vehicle or equipment. For instance, in the absence of resetting, back-power may trip the system, but the driver or operator of the vehicle or equipment will be under the false impression system of the system being in the "ON" status while the system is actually in the "OFF" status. To avoid such incidents, the system is reset (ON and OFF) once every minute for better operation of the vehicle or apparatus.

According to global standards, an intrinsically safe power supply is 100 milli watts and 29 volts. According to an embodiment of the present invention, the system achieves specifications below the global intrinsically safe standards by excluding power amplifiers and operating at low power levels.

The printed circuit board of FIG. 1*a* and FIG. 1*b* is mounted on discharge electrodes and covered with an enclosure cover which is leak-proof from any air or gas entrainment. Low power high frequency waves pass through discharge electrodes (E1, R1, E2, R2, E3, R3, E4, R4) which are dipped in the fuel as shown in FIG. 1*a*, FIG. 1*b*, and FIG. 2. These discharge electrodes (E1, R1, E2, R2, E3, R3, E4, R4) are fitted onto a housing (H) which is leak-proof for a minimum pressure of 20 bar. The pins of said discharge electrodes (E1, R1, E2, R2, E3, R3, E4, R4) extend into a housing (H). Said housing (H) comprises a fuel inlet (F-I) and a fuel outlet (F-O). The low power high frequency waves pass through the fuel present in said housing (H) and through the entire engine and exit from the exhaust along with exhaust gases generated during the combustion process. Said high frequency waves aid in the mixing of fuel and air in the case of gasoline engines, diesel engines, and compression ignition engines, through improved atomization of air-fuel mixture which is responsible for better ignition and complete combustion. This helps the engine to run with a lean mixture and thereby achieve better thermal efficiency, especially when engines are running at acceleration mode. The lean mixture has an air-fuel ratio of 14.5:1 for gasoline engines, and 25:1 for diesel engines. Lean mixtures are most efficient and emit less emissions in a fuel system, and hence, running engines on lean mixture enhances thermal efficiencies, and reduces emissions.

Oil refineries add cetane boosters or octane boosters, and detergents to fuels in order to achieve complete combustion and reduce carbon deposition inside the engine. This is a solution to reduce the intensity of carbon deposition and prolong engine life. However, the present invention enables alleviation of carbon deposition inside the engine throughout the running cycle, and the engine can be run with lean mixture to improve fuel efficiency, and thus reduce emissions.

Upon use of chemicals and detergents to clean the engine instantaneously, the cleaned carbon settles on the catalytic converter and ignites the catalytic converter resulting in sintering of the catalyst and a drop in the performance of the catalytic converter.

Delayed cleaning of the deposited carbon makes it very brittle thus making it nearly impossible for the deposited carbon scales to be cleaned using chemicals or detergents. The only possible way of cleaning is mechanical scrapping and/or use of special alkaline or acidic chemicals which may cause surface pitting.

Also, if carbon deposition in the engine is significant, engine valves and valve seats cannot be closed properly thus leading to leakage of air fuel mixture and/or exhaust gases.

If carbon deposits on the piston and/or piston head, scavenging of exhaust gases is a challenge, and hence piston crown and head crown are used for gasoline IC engines for better scavenging of exhaust gases. If carbon deposited on valves and piston heads is not cleaned on time, the deposited carbon turns very hard like a diamond.

Chemicals such as polybutene amine (PBA) are generally used to clean injectors and valves, which however, may increase combustion chamber deposits, while other chemicals such as polyetheramine (PEA) are generally used to clean the entire fuel system as well as the combustion chambers. The carbon deposits that build up on the intake valves reduce the air flow to the cylinders thus reducing torque and horsepower, and impacting the fuel economy. The carbon deposited on the IC engine components can cause pre-ignition, rough start, rough idling, fouling of spark plugs, and causing misfire codes. When low power high frequency waves are pumped into the engine along with the fuel oil and air fuel mixture in accordance with the embodiments of the present invention, high temperature exhaust gases exit, for instance, through the silencer, in the case of vehicles. The high frequency waves in accordance with the present invention help in cleaning the entire engine throughout its life, and also in improving the mixing of air and fuel, while reducing emissions.

In the case of diesel engines, low power high frequency waves travel along with the fuel oil to the high-pressure injector, and aid in the cleaning of the injector nozzle continuously. Said waves enter into the engine head and aid in better mixing of the fuel and combustion air. Enhanced mixing of the fuel and combustion air improves combustion, and engines can run on lean mixture while cleaning the deposited carbon in the engine.

According to the embodiments of the present invention, when the high frequency waves are generated, they collide and multiply, leading to generation of waves of broader range of frequencies (A) within the fuel lines, engine heads, and exhaust gas emissions pathway. When the waves are superimposed, waves of a broader frequency which is a sum of the frequencies of any two waves of the four frequency ranges are generated, and this collision leads to generation of waves of broader range of frequencies (A), which aids in achieving the various objects of the invention and benefits disclosed herein.

The high frequency waves of different ranges also split hydrocarbon molecules into hydrogen and methane gases, thus aiding in better ignition and complete combustion, as tested using gas chromatography considering unprocessed fuel (raw fuel) and processed fuel (fuel passed through the system of the present invention). Upon completion of the working cycle, said low power high frequency waves exit the engine along with the exhaust gases through the exhaust valves simultaneously cleaning the deposited carbon from all the internal, moving and stationary parts of the engine. This continuous cleaning reduces the pressure drop and back pressure in the engine. When the engine is free from carbon depositions, back pressure reduces and there is proper air intake which enables proper maintenance of air fuel ratio and enhanced fuel atomization, thereby resulting in overall thermal efficiency of the engine.

Exhaust pressure exerted on engine depletes engine performance and scavenging of exhaust gases is also affected which in turn will reduce overall engine performance including efficiency and efficacy. It has been observed that with the use of the system of the present invention, the back pressure is reduced. As the system of the present invention does not comprise filter cartridges or elements, there is absolutely zero pressure drop in the fuel line as well.

According to the embodiments of the present invention, the system is operated at less than 4 milli ampere power which is low power for any engine.

The system of the present invention works efficiently for different types of internal combustion engines, and fuels which may be liquids and gases of different viscosities, densities and calorific values. This is apparent from the various embodiments and examples provided herein.

It may be noted that the examples provided herein are only representative, and the present invention is not limited to the examples considered for the study.

Use of the system of the present invention reduces emissions from the vehicles. This has been evaluated for different types of engines using I3SYS EDM 1602 exhaust analyzer for diesel engines. The results are presented in Tables 1, 2 and 3.

The system of the present invention demonstrates significant reduction in vehicular and industrial emissions. Emission levels were measured using I3SYS EDM 1602 exhaust analyzer across multiple vehicle types—a 2019 Mahindra SUV 300 diesel vehicle with a 1497 CC engine delivering 115 BHP and 300 N·m torque, a 2019 Mahindra Bolero with a 1493 CC engine delivering 74.96 BHP and 210 N·m torque, and a 1986 TATA truck with a 1493 CC engine delivering 74.96 BHP and 210 N·m torque, and the results are presented in Tables 1, 2, 3, and 4 respectively.

TABLE 1

Emissions from 2019 Mahindra SUV 300 diesel vehicle

| Emission parameter | Without system* | With system* | Reduction in emissions (%) using system* of present invention |
|---|---|---|---|
| HU Value % average | 14.63 | 8.37 | 71.57 |
| Carbon monoxide (CO) % | 0.017 | 0.012 | 41.66 |
| Carbon dioxide ($CO_2$) % | 2.98 | 2.8 | 6.43 |

*System of present invention

TABLE 2

| Emissions from 2019 Mahindra Bolero diesel vehicle | | | |
|---|---|---|---|
| Emission parameter | Without system* | With system* | Reduction in emissions (%) using system* of present invention |
| HU Value % average | 16.43 | 10.3 | 59.5 |
| Carbon monoxide (CO) % | 0.029 | 0.019 | 52.3 |
| Carbon dioxide ($CO_2$) % | 3.40 | 3.31 | 2.7 |

*System of present invention

TABLE 3

| Emissions from 1986 TATA diesel truck | | | |
|---|---|---|---|
| Emission parameter | Without system* | With system* | Reduction in emissions (%) using system* of present invention |
| HU Value % average | 24.61 | 18.3 | 34.5 |
| Carbon monoxide (CO) % | 0.16 | 0.094 | 70.2 |
| Hydrocarbon (in ppm) | 184 | 72 | 155.6 |
| Carbon dioxide ($CO_2$) % | 3.28 | 3.19 | 2.82 |

*System of present invention

As is evident from the results depicted in Tables 1, 2, and 3, there was notable decrease in Hartridge Value (HU %), hydrocarbon content, carbon monoxide (CO), and carbon dioxide ($CO_2$) emissions, when the system of the present invention was used.

Additionally, tests on a Caterpillar make diesel generator with a capacity of 2500 KW, as shown in Table 4, revealed substantial reduction in $NO_x$, $SO_x$, and particulate matter emissions, highlighting the efficacy of the system of the present invention thereby improving environmental compliance and reducing pollutant levels.

TABLE 4

| Emissions tested in Caterpillar diesel generator | | | |
|---|---|---|---|
| Parameter | Without system* | With system* | Reduction in emissions (%) using system* of present invention |
| $NO_x$ (in ppm) | 800 | 548 | 45.99 |
| PM (Particulate Matter) (in ppm) | 14.3 | 12 | 19.2 |
| $SO_x$ (in ppm) | 22.8 | 14.3 | 59.4 |
| Oxygen ($O_2$) % | 12.1 | 11.45 | 5.68 |
| Carbon dioxide ($CO_2$) % | 6.9 | 6.85% | 0.73 |
| Carbon monoxide (CO) (in ppm) | 226 | 59.6 | 279 |

*System of present invention

The present invention relates to advancements in engine emission and noise control systems, as demonstrated through testing conducted under ISO 8178 standards and complies with CPCB II norms. The equipment under evaluation was a Kirloskar GENSET powered by a direct injection (DI), INLINE, water-cooled (WC), turbocharged with intercooling (TCIC) inline engine, featuring a swept volume of 8.858 liters and producing 183 kW at 1500 RPM. The engine achieves a maximum torque of 1165 N·m when tested using a SAJ AG 350 dynamometer. Emissions and performance were analyzed using the AMA-i-60-04 test system across various torque and speed conditions. The results are presented in Tables 5, 6, 7, and 8.

TABLE 5

| $NO_x$ measurement without and with system of present invention | | | | |
|---|---|---|---|---|
| | | $NO_x$ (ppm) | | |
| Torque (N · m) | Speed (RPM) | Without system* | With system* | % change with system* |
| 1165 | 1505 | 455 | 405 | −12.4 |
| 873 | 1502 | 356 | 316 | −12.7 |
| 582 | 1502 | 259 | 231 | −12.12 |
| 291 | 1502 | 217 | 195 | −11.3 |
| 116.5 | 1502 | 172 | 152 | −13.15 |

*System of present invention

TABLE 6

| $CO_2$ measurement without and with system of present invention | | | | |
|---|---|---|---|---|
| | | $CO_2$ (%) | | |
| Torque (N · m) | Speed (RPM) | Without system* | With system* | % change with system* |
| 1165 | 1505 | 8.35 | 8.08 | −3.34 |
| 873 | 1502 | 7.47 | 6.18 | −20.9 |
| 582 | 1502 | 6.50 | 5.02 | −29.5 |
| 291 | 1502 | 5.36 | 4.04 | −32.7 |
| 116.5 | 1502 | 8.35 | 8.08 | −32.9 |

*System of present invention

TABLE 7

| Air-fuel ratio measurement without and with system of present invention | | | | |
|---|---|---|---|---|
| | | Air:Fuel ratio | | |
| Torque (N · m) | Speed (RPM) | Without system* | With system* | % change with system* |
| 1165 | 1505 | 26 | 26 | No change |
| 873 | 1502 | 29.1 | 29 | −0.35 |
| 582 | 1502 | 33.4 | 33 | −1.2 |
| 291 | 1502 | 40.3 | 39.6 | −1.77 |
| 116.5 | 1502 | 8.35 | 8.08 | −1.9% |

*System of present invention

TABLE 8

| Exhaust back pressure measurement without and with system of present invention | | | | |
|---|---|---|---|---|
| | | Exhaust back pressure (mmHg) | | |
| Torque (N · m) | Speed (RPM) | Without system* | With system* | % change with system* |
| 1165 | 1505 | 49.5 | 46.2 | −7.14 |
| 873 | 1502 | 32.8 | 29.5 | −11.2 |
| 582 | 1502 | 19.6 | 16.2 | −20.99 |
| 291 | 1502 | 8.9 | 5.4 | −64.82 |
| 116.5 | 1502 | 4.8 | 1.4 | −242.9 |

*System of present invention

The results presented in Table 5 indicate significant reduction in $NO_x$ emissions, with reductions ranging from 11.2% to 13.15%, while results presented in Table 6 indicate reduction in $CO_2$ emissions of up to 32.9%, when using the system of the present invention. 1 kg of fuel generally generates 2.7 kg of $CO_2$. With the use of the system of the present invention, $CO_2$ generation was 0.9% less than that without the use of the system of the present invention. Therefore, the fuel saving is 1/2.7. Additionally, Tables 7 and 8 respectively show marginal improvements in air-fuel ratios and a substantial reduction in exhaust back pressure of even up to 242.9% in certain conditions. These results highlight the efficacy of the system of the present invention in enhancing performance in terms of emissions while maintaining the operational integrity of the GENSET system. This innovation represents a step forward in meeting stringent environmental standards and optimizing engine efficiency.

As is evident from Tables 1, 2, 3, 4, 5, 6, 7, and 8, comparing the results with and without the use of the system of the present invention, there is substantial reduction in emissions, and improved air-fuel ratios and back pressures, upon use of the system of the present invention wherein high frequency waves of different ranges are used to generate waves of broader range of frequencies (A).

The disclosed invention pertains to a system that also reduces noise for internal combustion engines, which was validated through comprehensive testing on gasoline and diesel vehicles under varying conditions. Noise levels were measured using a METRAVI ET-99SL Mini Sound Level Meter in the car dashboard across engine speeds ranging from 800 RPM to 3000 RPM, in a 2022 XL6 Maruti Suzuki gasoline vehicle with a 1462 cc engine delivering 101.64 BHP and 136.8 N·m torque, and a 2019 Mahindra SUV300 diesel vehicle with a 1497 cc engine producing 115 BHP and 300 N-m torque, and the results are presented in Tables 9 and 10 respectively.

TABLE 9

Noise level measurements in 2022 XL6 Maruti Suzuki gasoline vehicle

| Speed of Engine (RPM) | Noise level (dB(A)) Without system* | Noise level (dB(A)) With system* | % of noise level change |
|---|---|---|---|
| 800 | 16.4 | 14 | −17.14% |
| 1500 | 18.7 | 16.5 | −13.3% |
| 2000 | 23.1 | 20.8 | −11.05% |
| 2500 | 30.4 | 27 | −12.59% |
| 3000 | 35.6 | 29.8 | −19.46% |

*System of present invention

TABLE 10

Noise level measurements in 2019 Mahindra SUV300 diesel vehicle

| Speed of Engine (RPM) | Noise level (dB(A)) Without system* | Noise level (dB(A)) With system* | % of noise level change |
|---|---|---|---|
| 800 | 21.2 | 18.2 | −16.48% |
| 1500 | 24.2 | 20.5 | −18.04% |
| 2000 | 28.6 | 24.2 | −18.18% |
| 2500 | 36.3 | 32.3 | −12.38% |
| 3000 | 41.6 | 36 | −15.5% |

*System of present invention

The present invention was further evaluated for its noise reduction efficiency by employing high-frequency waves across distinct frequency ranges and combinations thereof. Experiments were conducted on a 2022 Maruti Suzuki XL6 gasoline vehicle equipped with a 1462 cc engine producing 101.64 BHP and 136.8 N·m torque. Noise levels were measured within the vehicle cabin using a METRAVI ET-99SL Mini Sound Level Meter across various engine speeds (800 RPM to 3000 RPM). Additionally, the impact of the system of the present invention on fuel efficiency was assessed by comparing the mileage performance of the vehicle with and without the system of the present invention. The results presented in Table 11, demonstrate that the system of the present invention effectively reduces noise levels when specific frequency ranges (5-15 kHz, 3-30 kHz, 15-45 kHz, and 80 kHz) are activated. However, the most substantial noise reduction was achieved when the system was operated with all the four aforementioned frequency ranges, namely, when 5-15 kHz, 3-30 kHz, 15-45 kHz, and 80 kHz were applied simultaneously. Noise levels as low as 14 dB (A) at 800 RPM and 29.8 dB (A) were achieved at 3000 RPM. These findings demonstrate the capability of the system of the present invention to optimize noise reduction through tailored frequency modulation, offering enhanced acoustic comfort within vehicle cabins.

Furthermore, the mileage of the vehicle improved from 15.8 km/L without the use of the system of the present invention to 17.4 km/L with the use of the system of the present invention, indicating a 10.12% increase in fuel efficiency. These findings highlight the multiple benefits of the system. It reduces noise pollution, and also enhances fuel economy, thereby making it a valuable innovation for automotive applications.

TABLE 11

Noise level measurements at different ranges of frequencies

| Speed of Engine (RPM) | Noise Level (dB(A)) Only 5-15 KHz applied | Only 3-30 KHz applied | Only 15-45 KHz applied | Only 80 KHz applied | All 4 frequency ranges (5-15 KHz, 3-30 KHz, 15-45 KHz, and 80 KHz) applied |
|---|---|---|---|---|---|
| 800 | 15.8 | 15.8 | 15.2 | 15.4 | 14 |
| 1500 | 17.6 | 17.7 | 17.6 | 17.6 | 16.5 |
| 2000 | 22.3 | 22.0 | 23.2 | 23.4 | 20.8 |
| 2500 | 28.5 | 28.5 | 29.2 | 29.1 | 27 |
| 3000 | 33.4 | 34.5 | 35.2 | 34.8 | 29.8 |

According to the embodiments of the present invention, the carbon deposits are continuously cleaned in the engines and throughout the flow path of the fuel by the waves of broader range of frequencies (A) generated by the collision of the different ranges of high frequency waves used in the system of the present invention. This was verified through experimentation. Vehicles considered for the study include but are not limited to, a 2019 Mahindra SUV 300 diesel vehicle with a 1197 CC engine delivering 108 BHP, and a 2022 Maruti Suzuki XL6 gasoline vehicle with a swept volume of 1462 CC delivering 101 BHP, and the results are presented in Tables 12 and 13, respectively.

TABLE 12

| Distance covered | Thickness of Carbon deposition in tail pipe of engine (in Microns) | Rate of Carbon thickness removed per 1000 Kms |
|---|---|---|
| 113,484 Kilometers at time of fitting the system of the present invention | 268 | |
| 121,578 Kilometers | 189 microns | 9.7 Micron reduction per every 1000 Kms running |

TABLE 13

| Distance covered | Thickness of Carbon deposition in tail pipe of engine (in Microns) | Rate of Carbon thickness removed per 1000 Kms |
|---|---|---|
| 44,569 Kilometers at time of fitting the system of the present invention | 148 microns | |
| 83,292 Kilometers | 0 microns | 3.79 Micron per 1000 Kms running |

According to the embodiments of the present invention, the system of the present invention aids in reduction of emissions and improvement of fuel economy in gaseous and liquid fuel internal combustion engines, while also reducing carbon deposits on rotary, reciprocating, stationary parts of engines.

According to the embodiments of the present invention, the high frequency waves of different frequency ranges collide with each other and split the hydrocarbon molecules to hydrogen molecules and methane gas. The change in the composition of the fuel using the system of the present invention has been tested using gas chromatography technique, using SHIMADZU GC-2014, and the results when the fuel is diesel and gasoline are presented in Table 14 and Table 15, respectively.

TABLE 14

| DIESEL UNPROCESSED | | | | DIESEL PROCESSED USING SYSTEM OF PRESENT INVENTION | | | |
|---|---|---|---|---|---|---|---|
| Peak# | Retention Time | Area | Area % | Peak# | Retention Time | Area | Area % |
| 1 | 3.256 | 499051 | 0.2802 | 1 | 3.335 | 509487 | 0.3165 |
| 2 | 3.539 | 269546 | 0.1514 | 2 | 3.799 | 1170539 | 0.7271 |
| 3 | 3.731 | 1071935 | 0.602 | 3 | 3.940 | 2313358 | 1.4369 |
| 4 | 3.820 | 475273 | 0.2669 | 4 | 4.346 | 2128407 | 1.322 |
| 5 | 3.877 | 2265725 | 1.2723 | 5 | 4.452 | 1582744 | 0.9831 |
| 6 | 4.288 | 2361567 | 1.3262 | 6 | 4.535 | 901785 | 0.5601 |
| 7 | 4.399 | 2117296 | 1.189 | 7 | 4.733 | 5111235 | 3.1747 |
| 8 | 4.484 | 1018460 | 0.5719 | 8 | 5.081 | 1792338 | 1.1133 |
| 9 | 4.686 | 6041397 | 3.3926 | 9 | 5.356 | 4862495 | 3.0202 |
| 10 | 4.973 | 2094440 | 1.1762 | 10 | 5.700 | 6983133 | 4.3374 |
| 11 | 5.319 | 6132307 | 3.4437 | 11 | 6.034 | 2595860 | 1.6124 |
| 12 | 5.667 | 6450540 | 3.6224 | 12 | 6.384 | 3687520 | 2.2904 |
| 13 | 5.868 | 1390971 | 0.7811 | 13 | 6.789 | 4550637 | 2.8265 |
| 14 | 6.002 | 2762424 | 1.5513 | 14 | 7.179 | 4299049 | 2.6703 |
| 15 | 6.359 | 4103426 | 2.3043 | 15 | 7.529 | 3929541 | 2.4407 |
| 16 | 6.768 | 5176079 | 2.9067 | 16 | 7.989 | 3313511 | 2.0581 |
| 17 | 7.157 | 5379149 | 3.0207 | 17 | 8.298 | 4201720 | 2.6098 |
| 18 | 7.510 | 4980871 | 2.7971 | 18 | 8.791 | 4607713 | 2.862 |
| 19 | 7.975 | 4062378 | 2.2813 | 19 | 9.267 | 3786881 | 2.3521 |
| 20 | 8.282 | 4833118 | 2.7141 | 20 | 9.464 | 7456827 | 4.6316 |
| 21 | 8.780 | 5268448 | 2.9585 | 21 | 10.594 | 12381542 | 7.6905 |
| 22 | 9.258 | 4199505 | 2.3583 | 22 | 11.782 | 5771645 | 3.5849 |
| 23 | 9.455 | 8108554 | 4.5534 | 23 | 12.059 | 10259099 | 6.3722 |
| 24 | 10.589 | 9753005 | 5.4769 | 24 | 12.892 | 6669570 | 4.1427 |
| 25 | 11.658 | 6290101 | 3.5323 | 25 | 13.378 | 10177425 | 6.3215 |
| 26 | 11.940 | 10385409 | 5.832 | 26 | 14.699 | 11334573 | 7.0402 |
| 27 | 12.786 | 6902345 | 3.8761 | 27 | 15.380 | 3307233 | 2.0542 |
| 28 | 13.279 | 10950075 | 6.1491 | 28 | 16.145 | 8132072 | 5.0511 |
| 29 | 14.614 | 13899329 | 7.8053 | 29 | 17.778 | 6388693 | 3.9682 |
| 30 | 15.300 | 4517009 | 2.5366 | 30 | 19.686 | 5226439 | 3.2463 |
| 31 | 16.069 | 9018706 | 5.0645 | 31 | 21.964 | 4387631 | 2.7253 |
| 32 | 17.711 | 6877913 | 3.8624 | 32 | 24.735 | 3382412 | 2.1009 |
| 33 | 19.624 | 5598546 | 3.1439 | 33 | 25.294 | 684011 | 0.4249 |
| 34 | 21.905 | 4601527 | 2.584 | 34 | 28.146 | 3110493 | 1.932 |
| 35 | 24.681 | 3880646 | 2.1792 | | | | |
| 36 | 25.248 | 990116 | 0.556 | | | | |
| 37 | 28.084 | 3348528 | 1.8804 | | | | |
| | TOTAL | 178075715 | | | | 160997618 | |

TABLE 15

| GASOLINE UNPROCESSED | | | | GASOLINE PROCESSED USING SYSTEM OF PRESENT INVENTION | | | |
|---|---|---|---|---|---|---|---|
| Peak# | Retention Time | Area | Area % | Peak# | Retention Time | Area | Area % |
| 1 | 2.626 | 4989867 | 1.5621 | 1 | 2.586 | 2359596 | 1.3766 |
| 2 | 2.799 | 27043244 | 8.4663 | 2 | 2.768 | 13980697 | 8.1566 |
| 3 | 2.973 | 25930577 | 8.1179 | 3 | 2.941 | 12937534 | 7.5480 |
| 4 | 3.138 | 14188757 | 4.442 | 4 | 3.103 | 7106144 | 4.1458 |

TABLE 15-continued

| GASOLINE UNPROCESSED | | | | GASOLINE PROCESSED USING SYSTEM OF PRESENT INVENTION | | | |
|---|---|---|---|---|---|---|---|
| Peak# | Retention Time | Area | Area % | Peak# | Retention Time | Area | Area % |
| 5 | 3.311 | 4588475 | 1.4365 | 5 | 3.275 | 2308788 | 1.3470 |
| 6 | 3.439 | 4598247 | 1.4395 | 6 | 3.401 | 2305589 | 1.3451 |
| 7 | 3.698 | 18741391 | 5.8673 | 7 | 3.665 | 9329743 | 5.4431 |
| 8 | 3.862 | 9530112 | 2.9835 | 8 | 3.828 | 4684086 | 2.7328 |
| 9 | 4.007 | 7770658 | 2.4327 | 9 | 3.973 | 3930490 | 2.2931 |
| 10 | 4.277 | 3858258 | 1.2079 | 10 | 4.243 | 1823759 | 1.0640 |
| 11 | 4.483 | 4632314 | 1.4502 | 11 | 4.451 | 2272695 | 1.3259 |
| 12 | 4.778 | 7601598 | 2.3798 | 12 | 4.748 | 3763196 | 2.1155 |
| 13 | 4.911 | 13353454 | 4.1805 | 13 | 4.883 | 6767535 | 3.9483 |
| 14 | 5.199 | 12564252 | 3.9334 | 14 | 5.173 | 6206225 | 3.6208 |
| 15 | 5.805 | 4495902 | 1.4075 | 15 | 5.781 | 2192545 | 1.2792 |
| 16 | 6.114 | 7979492 | 2.4981 | 16 | 6.092 | 4115148 | 2.4008 |
| 17 | 6.251 | 4407232 | 1.3793 | 17 | 6.230 | 2361015 | 1.3775 |
| 18 | 6.428 | 31519240 | 9.8675 | 18 | 6.415 | 16581723 | 9.6741 |
| 19 | 6.597 | 7003175 | 2.1924 | 19 | 6.579 | 3662392 | 2.1367 |
| 20 | 7.551 | 3860030 | 1.2084 | 20 | 7.537 | 2336726 | 1.3633 |
| 21 | 7.683 | 1586078 | 0.4965 | 21 | 7.668 | 978692 | 0.5710 |
| 22 | 7.873 | 7392317 | 2.3143 | 22 | 7.860 | 4170620 | 2.4332 |
| 23 | 7.971 | 30017542 | 9.3974 | 23 | 7.960 | 17338093 | 10.1153 |
| 24 | 8.409 | 11492045 | 3.5977 | 24 | 8.397 | 6455466 | 3.7662 |
| 25 | 8.598 | 400055 | 0.1252 | 25 | 8.588 | 316073 | 0.1844 |
| 26 | 8.831 | 2340497 | 0.7327 | 26 | 8.824 | 1609547 | 0.9390 |
| 27 | 9.383 | 15929142 | 4.9868 | 27 | 9.374 | 9873191 | 5.7602 |
| 28 | 9.748 | 2937169 | 0.9195 | 28 | 9.742 | 1861497 | 1.0860 |
| 29 | 9.946 | 11374350 | 3.5609 | 29 | 9.939 | 7282922 | 4.2490 |
| 30 | 10.497 | 3681223 | 1.1525 | 30 | 10.492 | 1767662 | 1.0313 |
| 31 | 10.748 | 1733795 | 0.5482 | 31 | 10.745 | 931452 | 0.5340 |
| 32 | 10.839 | 2508235 | 0.7852 | 32 | 10.835 | 1891587 | 1.1036 |
| 33 | 11.200 | 2249292 | 0.7042 | 33 | 11.196 | 1552677 | 0.9059 |
| 34 | 11.343 | 1360081 | 0.4258 | 34 | 11.340 | 1242643 | 0.7250 |
| 35 | 11.975 | 2995523 | 0.9378 | 35 | 11.973 | 1643678 | 0.9590 |
| 36 | 12.593 | 1674721 | 0.5243 | 36 | 12.451 | 244695 | 0.1428 |
| 37 | 13.114 | 527421 | 0.1658 | 37 | 12.592 | 796964 | 0.4650 |
| 38 | 13.505 | 567884 | 0.1778 | 38 | 13.510 | 420707 | 0.2454 |
| | Total | 319423645 | | | | 171403792 | |

Power consumption with and without the system of the present invention was assessed, and the results obtained with different fuels in different scenarios are presented in Table 16. It can be observed from Table 16, that the net power is low. The system of the present invention was analyzed for its power consumption characteristics under various conditions and with different fuel types. Measurements were conducted both without load and at varying engine speeds (1000 RPM to 3000 RPM) to assess the impact of the system of the present invention on power efficiency. The results presented in Table 16 demonstrate that power consumption remains minimal, with no-load consumption consistently at 8 mA considered as an example, across all scenarios.

TABLE 16

| Power consumption different speeds of engine | |
|---|---|
| Speed of Engine (RPM) | Power consumption (mA) |
| 1000 | 19 |
| 1500 | 23 |
| 2000 | 26 |
| 2500 | 39 |
| 3000 | 44 |

The present invention provides a novel system for reducing emissions and maintenance cost of heat engines along with fuel savings. The fuel consumption with and without the use of the system of the present invention has been studied, and the results are presented in Table 17. The results indicate lower fuel consumption when the system of the present invention is fitted in vehicles. It was found to be effective for both diesel and gasoline run vehicles. The system of the present invention is also effective in the case of engines operated with furnace oil, heavy fuel oils, heating equipment such as furnaces, kilns, boilers, ovens, diesel operated power generating sets, marine fuel operated ship engines, and turbochargers.

TABLE 17

| Comparison of power consumption with different fuels and conditions | | |
|---|---|---|
| FUEL | POWER ON; NO LOAD | POWER ON; WITH LOAD |
| DIESEL | 8 milli Amperes | 65 milli Amperes |
| GASOLINE (PETROL) | 8 milli Amperes | 62 milli Amperes |

As is evident from Table 17, under load conditions, power consumption varied slightly depending on the fuel type, with diesel recording 65 mA and gasoline (petrol) recording 62 mA. This highlights the efficient energy use when using the system of the present invention while maintaining compatibility with different fuels. The low power demand of the system of the present invention, even under load, underscores its practicality and energy efficiency, ensuring that it operates effectively without imposing significant additional energy requirements.

The present invention further provides a method for enhancing thermomechanical efficiency and reducing emissions and noise of internal combustion (IC) engines, comprising of generating low power, high frequency waves within specific frequency ranges, increasing the intersection of said waves within a fuel line or fuel tank using a booster (B), wherein the intersection of the waves generates a broader range of frequencies, enhancing energy density in the fuel using soft ferrite coils (FC1-FW1, FC2-FW2, FC3-FW3, FC4-FW4), sensing magnetic fluxes from the fuel using a magnetic pick-up (MPU), regulating power output based on fuel consumption and engine load using a feedback mechanism (FBM), and transmitting the waves of broader range of frequencies through the exhaust gases throughout the engine, exhaust system, and EGR actuator and valve. Said method provides for reduced exhaust emissions and noise levels by improving combustion and reducing back pressure.

The present invention further provides an engine system comprising an engine and a system, as defined herein, in fluid communication with the engine's fuel system. The system is configured to enhance thermomechanical efficiency by mitigating carbon deposits across the engine, exhaust system, and EGR actuator and valve. The present invention provides a novel comprehensive system and method designed to significantly improve the thermomechanical efficiency of engines by enhancing fuel atomization, optimizing combustion, and reducing emissions. The system of the present invention effectively addresses noise levels and maintenance requirements through continuous engine cleaning. Said system comprises a circuit equipped with a booster (B) that is connected in parallel to enhance increased interaction of low-power, high-frequency waves directed into the fuel line or fuel tank of IC engines. This interaction improves the atomization of liquid and gaseous fuels, thereby enhancing the combustion process. Power is sourced through a controlled power supply unit (PS) and flows into frequency generators (FG1, FG2, FG3, FG4), producing low-power, high-frequency waves in multiple ranges (5 to 15 kHz, 3 to 30 kHz, 15 to 45 kHz, and 80 kHz). These waves are modulated through frequency modulators (FM1, FM2, FM3, FM4) and processed via power switching modules (PSM1, PSM2, PSM3, PSM4). These waves are then transmitted to discharge electrodes (E1, R1, E2, R2, E3, R3, E4, R4), which are immersed in the fuel within a housing (H). Said system facilitates the entry of the fuel through an inlet (F-I) and exits through an outlet (F-O) after enhanced atomization, ignition, and combustion, thereby improving efficiency. The discharge electrodes are interfaced with soft ferrite coils (FC1-FW1, FC2-FW2, FC3-FW3, FC4-FW4), enhancing energy density in the fuel line for optimal combustion. Said soft ferrite coils (FC1-FW1, FC2-FW2, FC3-FW3, FC4-FW4) increase the flux generated in the fuel. Said system comprises a magnetic pick-up (MPU) that detects these flux variations and communicates with a feedback mechanism (FBM) that adjusts power input based on real-time engine load and fuel flow rates. This feedback adjusts frequency modulation in response to varying fuel demands, ensuring energy output that matches engine requirements. Such tailored frequency modulation optimizes noise reduction. The high-frequency waves intersect within the fuel to break down carbon deposits on engine components and within the catalytic converter, promoting continuous cleaning and extended component lifespan. This constant removal of carbon enhances thermal efficiency and minimizes particulate emissions, reducing engine wear and back pressure.

A person skilled in the art may understand that the system of the present invention is also effective for any heat engine operated using gaseous and/or liquid fuels, but not limited to, in internal combustion engines, jet propulsion engines, boilers and the like.

The system of the present invention has the advantages over the devices or systems known in the prior art in terms of use of low power due to which it does not cause any abrasion or have an impact on the materials of the engine components, not temperature-sensitive as the system of the novel system is installed away from the engine, which enables continuous cleaning of the engine valves, exhaust line, fuel manifolds, and catalytic converter. Said system of the present invention works well with liquid fuels and gaseous fuels, and does not reduce viscosity and density of fuel. The aforementioned advantages of the system of the present invention make the vehicles absolutely zero maintenance vehicles.

Said novel system of the present invention provides fuel efficiency, emission control, noise reduction, and reduced operational costs. This innovation promotes lean fuel mixing, minimal pressure drops, and optimized performance across diverse engine conditions, aligning with stringent environmental norms and contributing to sustainable engine technology.

It is to be understood, however, that the present invention would not be limited by any means to the components, arrangements and materials that are not specifically described, and any change to the materials, variations, and modifications can be made without departing from the scope of the claims of the present invention.

We claim:

1. A system for enhancing thermomechanical efficiency and reducing emissions and noise of internal combustion (IC) engines, comprising of:

a circuit comprising a plurality of frequency generators (FG1, FG2, FG3, FG4) configured to generate low power, high frequency waves with specific frequency ranges, a plurality of frequency modulators (FM1, FM2, FM3, FM4), a plurality of power switching modules (PSM1, PSM2, PSM3, PSM4), a plurality of discharge electrodes (E1, R1, E2, R2, E3, R3, E4, R4) for transmitting the high frequency waves into the fuel, and a controlled power supply unit (PS);

characterized by:

a booster (B) configured and positioned parallel to said circuit, for enhancing the intersection of said low-power, high-frequency waves within a fuel line or fuel tank, wherein the intersection of the waves generates a broader range of frequencies;

a plurality of ferrite coils (FC1-FW1, FC2-FW2, FC3-FW3, FC4-FW4) configured to enhance energy density in the fuel;

a magnetic pick-up positioned in the fuel line or fuel tank for sensing magnetic flux density within the fuel and providing real-time flux data; and a feedback mechanism (FBM) configured for receiving said real-time flux data from the magnetic pick-up and dynamically regulating energy density, energy pumped into the fuel, power output, and wave modulation based on engine load and fuel consumption.

2. The system as claimed in claim 1, wherein said frequency generators (FG1, FG2, FG3, FG4) generate high-frequency waves in the frequency ranges of 5 to 15 kHz, 3 to 30 kHz, 15 to 45 kHz, and 80 kHz.

3. The system as claimed in claim 1, wherein said booster (B) enhances the peak-to-peak value of the output signals by 15-25%.

4. The system as claimed in claim 1, wherein said ferrite coils (FC1-FW1, FC2-FW2, FC3-FW3, FC4-FW4) comprise soft ferrite cores (FC1, FC2, FC3, FC4) with winding wires (FW1, FW2, FW3, FW4).

5. The system as claimed in claim 1, wherein the number of ferrite coils (FC1-FW1, FC2-FW2, FC3-FW3, FC4-FW4) ranges from 2 to 8, and is based on the engine's fuel consumption rate.

6. The system as claimed in claim 1, wherein each ferrite core winding has adjustable turns ranging from 4 to 100.

7. The system as claimed in claim 1, wherein said ferrite coils (FC1-FW1, FC2-FW2, FC3-FW3, FC4-FW4) are housed within a housing (H) and are immersed in the fuel.

8. The system as claimed in claim 1, wherein said magnetic pick-up senses flux variations in the fuel and sends feedback signals to the feedback mechanism (FBM), wherein said feedback mechanism (FBM) dynamically adjusts the frequency modulation via frequency modulators (FM1, FM2, FM3, FM4) and the power supply unit (PS) to match the engine's load and operational needs.

9. The system as claimed in claim 1, wherein said discharge electrodes comprise a plurality of emitters (E1, E2, E3, E4) and receivers (R1, R2, R3, R4) immersed within the fuel line, to transmit the high-frequency waves through the ferrite coils.

10. The system as claimed in claim 1, wherein the distance between each set of an emitter and a receiver is 18 mm-36 mm.

11. The system as claimed in claim 1, wherein said magnetic pick-up and feedback mechanism (FBM) collaboratively regulate wave generation for real-time optimization of performance under dynamic operating conditions selected from variable engine speeds, load changes, and acceleration modes.

12. The system as claimed in claim 1, wherein said system further enables the continuous cleaning of internal engine components by the collision of the high frequency waves.

13. The system as claimed in claim 1, wherein said feedback mechanism (FBM) is configured with a momentary snap-action reset circuit to switch the system on and off periodically to reset the circuit and eliminate any internal back power.

14. The system as claimed in claim 1, wherein, the system is configured to enable engine operation with lean fuel mixtures.

15. The system as claimed in claim 1, wherein said boosted high-frequency waves interact with fuel and air to achieve lean combustion, wherein the air-to-fuel ratio ranges from 14.5:1 for gasoline engines to 25:1 for diesel engines, enabling higher thermal efficiency and lower emissions.

16. The system as claimed in claim 1, wherein the system reduces carbon monoxide (CO), carbon dioxide ($CO_2$), nitrogen oxides ($NO_x$), and particulate matter emissions by utilizing enhanced combustion efficiency from the collision of high-frequency waves.

17. The system as claimed in claim 1, wherein the high-frequency waves enhance the performance and extend lifespan of catalytic converters by reducing their operational load and scavenging carbon deposits.

18. The system as claimed in claim 1, wherein the collision of the high-frequency waves in the fuel line or fuel tank reduces carbon buildup, minimizes back pressure, pressure drop, and improves overall engine performance.

19. The system as claimed in claim 1, wherein said system improves fuel efficiency by 10% to 15%.

20. An engine system, comprising:

(i) an engine, and (ii) a system as defined in claim 1, in fluid communication with the engine fuel system, wherein the system is configured to enhance thermomechanical efficiency by reducing carbon deposits throughout the engine, exhaust system, and exhaust gas recirculation (EGR) actuator and valve.

21. A method for enhancing thermomechanical efficiency and reducing emissions and noise of internal combustion (IC) engines, comprising of:

(i) generating low power, high frequency waves within specific frequency ranges;

(ii) increasing the intersection of said waves within a fuel line or fuel tank using a booster (B), wherein the intersection of the waves generates a broader range of frequencies;

(iii) enhancing energy density in the fuel using soft ferrite coils (FC1-FW1, FC2-FW2, FC3-FW3, FC4-FW4);

(iv) sensing magnetic fluxes from the fuel using a magnetic pick-up (MPU);

(v) regulating power output based on fuel consumption and engine load using a feedback mechanism (FBM); and (vi) transmitting waves of broader range of frequencies throughout the engine, exhaust system, and exhaust gas recirculation (EGR) actuator and valve.

22. The method of claim 21, further comprises reducing noise levels and exhaust emissions by improving combustion and reducing back pressure.

23. The method of claim 21, wherein the step of transmitting waves of broader range of frequencies includes transmitting said waves through exhaust gases.

* * * * *